United States Patent
Brenndoerfer

(10) Patent No.: US 11,550,174 B2
(45) Date of Patent: Jan. 10, 2023

(54) OPERATING A HIGH-FREQUENCY DRIVER CIRCUIT

(71) Applicant: TRUMPF Schweiz AG, Gruesch (CH)

(72) Inventor: Knut Brenndoerfer, Seewis Dorf (CH)

(73) Assignee: TRUMPF Schweiz AG, Gruesch (CH)

(*) Notice: Subject to any disclaimer, the term of this patent is extended or adjusted under 35 U.S.C. 154(b) by 939 days.

(21) Appl. No.: 16/385,495

(22) Filed: Apr. 16, 2019

(65) Prior Publication Data
US 2019/0243169 A1 Aug. 8, 2019

Related U.S. Application Data

(63) Continuation of application No. PCT/EP2017/076484, filed on Oct. 17, 2017.

(30) Foreign Application Priority Data

Oct. 18, 2016 (DE) .......................... 102016220349.5

(51) Int. Cl.
*G02F 1/11* (2006.01)
*G02F 1/33* (2006.01)
(Continued)

(52) U.S. Cl.
CPC ................ *G02F 1/113* (2013.01); *G02F 1/11* (2013.01); *G02F 1/33* (2013.01); *H03F 3/189* (2013.01);
(Continued)

(58) Field of Classification Search
CPC ... G02F 1/113; G02F 1/11; G02F 1/33; H03F 3/189; H03F 2200/18; H03F 2200/27;
(Continued)

(56) References Cited

U.S. PATENT DOCUMENTS 1,882,119 A    10/1932  Chireix
4,198,675 A     4/1980  Moore
(Continued)

FOREIGN PATENT DOCUMENTS

CN    1388724 A    1/2003
CN    1838530 A    9/2006
(Continued)

OTHER PUBLICATIONS

CN Office Action in Chinese Appln. No. 201780064469.3. dated Jan. 26, 2022, 16 pages (with English translation).
(Continued)

*Primary Examiner* — Nhan T Le
(74) *Attorney, Agent, or Firm* — Fish & Richardson P.C.

(57) ABSTRACT

A high-frequency (HF) driver circuit for an acousto-optical component includes an HF power amplifier connected to a voltage regulator for supply with a supply voltage and a bias voltage generator connected to an input of the HF power amplifier via a switch. The HF driver circuit can include a measurement device configured to measure a temperature of the HF power amplifier and a compensation device configured to control the bias voltage generator according to the temperature. The bias voltage generator is configured to provide a bias voltage to the HF power amplifier. By switching in the bias voltage, the HF power amplifier can be adjusted to a low quiescent current. By switching off the bias voltage, the HF power amplifier can be very rapidly and effectively blocked. As a result, very rapid switching-on and switching-off times, e.g., in a range of 10 to 50 ns, can be achieved.

23 Claims, 1 Drawing Sheet

(51) Int. Cl.
*H03F 3/189* (2006.01)
*H03G 3/30* (2006.01)

(52) U.S. Cl.
CPC ....... *H03G 3/3042* (2013.01); *H03F 2200/18* (2013.01); *H03F 2200/27* (2013.01); *H03F 2200/42* (2013.01); *H03F 2200/468* (2013.01); *H03F 2200/48* (2013.01)

(58) Field of Classification Search
CPC ........... H03F 2200/42; H03F 2200/468; H03F 2200/48; H03G 3/3042
See application file for complete search history.

(56) References Cited

U.S. PATENT DOCUMENTS

| | | | |
|---|---|---|---|
| 4,444,470 | A | 4/1984 | Ioka et al. |
| 6,700,440 | B2 | 3/2004 | Hareyama |
| 7,274,266 | B2 | 9/2007 | Kirchmeier |
| 7,332,966 | B2 | 2/2008 | Furuya et al. |
| 7,994,862 | B1 | 8/2011 | Pukhovski |
| 9,698,734 | B2 | 7/2017 | Lehtola et al. |
| 10,042,407 | B2 | 8/2018 | Grede et al. |
| 2002/0085085 | A1* | 7/2002 | Fischer ................ H04N 1/0635 347/239 |
| 2007/0222520 | A1 | 9/2007 | Inamori et al. |
| 2007/0236292 | A1* | 10/2007 | Bocock ................ H03F 1/0216 330/285 |
| 2007/0281635 | A1 | 12/2007 | McCallister et al. |
| 2007/0291873 | A1* | 12/2007 | Saito ........................ H04B 1/04 375/298 |
| 2009/0116088 | A1 | 5/2009 | Okada et al. |
| 2011/0193628 | A1 | 8/2011 | Pukhovski |
| 2012/0200435 | A1 | 8/2012 | Ngo et al. |
| 2014/0292409 | A1 | 10/2014 | Nishimura |
| 2015/0115842 | A1 | 4/2015 | Heuermann et al. |
| 2016/0072445 | A1* | 3/2016 | Tsutsui .................... H03F 3/245 330/296 |
| 2016/0241203 | A1* | 8/2016 | Lehtola ................... H03F 3/191 |
| 2017/0264247 | A1* | 9/2017 | Nishimori ................ H03F 3/19 |

FOREIGN PATENT DOCUMENTS

| | | | |
|---|---|---|---|
| CN | 105897175 A | 8/2016 | |
| DE | 199 29 332 | 12/2000 | ............. H01S 3/117 |
| DE | 102013226511 | 6/2015 | ............. H03F 3/189 |
| DE | 102015218903 | 8/2016 | ............... H03F 1/30 |
| EP | 1 691 481 | 8/2006 | ............... H03C 1/36 |
| JP | S55-12976 | 1/1980 | |
| JP | S60-216328 A | 10/1985 | |
| JP | 2000-330082 | 11/2000 | |
| JP | 2000330082 A | 11/2000 | |
| JP | 2010-103 796 | 5/2010 | |
| JP | 2014-017624 | 1/2014 | |
| WO | WO 2013/076174 | 5/2013 | ............. H05B 41/24 |

OTHER PUBLICATIONS

JP Japanese Office Action in Japanese Appln. No. 2019-5207703, dated Jul. 28, 2021, 9 pages (with English translation).
The International Search Report and Written Opinion for International Application No. PCT/EP2017/076484, dated Jan. 31, 2018.
The German Office Action for German Application No. DE 10 2016 220 349.5 dated Sep. 1, 2017.
"Q Switches", Encyclopedia of Laser Physics and Technology, https://www.rp-photonics.com/q_switches.html; downloaded on Sep. 20, 2016.
"Acousto-optic Modulators", Encyclopedia of Laser Physics and Technology—acousto-optic modulators, AOM, Bragg Cells, https://www.rp-photonics.com/acousto_optic_moduiators.html, downloaded on Sep. 20, 2016.
"IC power-supply pin", Wikipedia, The Free Encyclopedia, (Apr. 12, 2016).
"Acousto-optical modulator", Wikipedia, The Free Encyclopedia, (Aug. 14, 2016).
"Quality Switches", Wikipedia, The Free Encyclopedia, Downloaded on Apr. 3, 2019.
Dodkin et al., "Analog Circuit Design", Analog Devices MT-037 Tutorial, (Aug. 30, 2011).

* cited by examiner

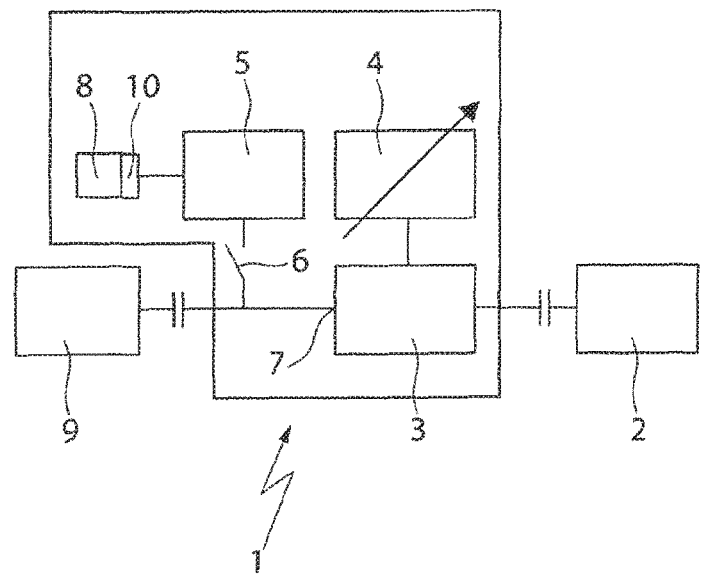

OPERATING A HIGH-FREQUENCY DRIVER CIRCUIT

CROSS REFERENCE TO RELATED APPLICATIONS

This application is a continuation of and claims priority under 35 U.S.C. § 120 from PCT Application No. PCT/EP2017/076484 filed on Oct. 17, 2017, which claims priority from German Application No. 10 2016 220 349.5 filed on Oct. 18, 2016. The entire contents of each of these priority applications are incorporated herein by reference.

TECHNICAL FIELD

The invention relates to a high-frequency driver circuit for an acousto-optical component having a high-frequency power amplifier and a method for operating a high-frequency driver circuit for controlling an acousto-optical component.

BACKGROUND

Acousto-optical components, such as, for example, acousto-optical modulators, are used in order to control the power, frequency or spatial direction of a laser beam with an electrical driver signal. This is based on the acousto-optical effect, that is to say, the modification of the refractive index as a result of the oscillating mechanical pressure of a sound wave.

The high-frequency degree of efficiency is in many available drivers for acousto-optical components relatively poor. Also with small output power levels, the power consumption hardly decreases, which leads to high demands on the cooling. The switching-on and switching-off times of high-frequency drivers for acousto-optical components are sometimes relatively long, in particular in the microsecond range, whilst switching times in the ns range would be desirable since the switching on and off is often carried out by means of a variable amplifier.

SUMMARY

An object of the present invention is to provide a driver circuit for an acousto-optical component which enables a rapid switching on and off with a high degree of efficiency.

One aspect of the present invention features a high-frequency driver circuit for an acousto-optical component having a high-frequency power amplifier which is connected to a voltage regulator in order to be supplied with a supply voltage, and having a bias voltage generator which is connected by means of a switching element to an input of the power amplifier. It is thereby possible for the high-frequency power amplifier to amplify the signal at the input thereof into an output signal. As a result of the limitation of the supply voltage by the voltage regulator, the high-frequency power amplifier may further be operated at saturation point. This means that changes of the signal shape and/or amplitude at the input of the high-frequency power amplifier lead to a proportional change of the signal to a large extent at the output of the amplifier. As a result of the voltage regulator, an adjustable D.C. voltage can be produced with sufficient current reserve to supply the high-frequency power amplifier.

Conventional high-frequency power transistors require for reasonable linear operation a base bias voltage (bipolar transistors) or a gate bias voltage (field-effect transistors). Via this bias voltage, the high-frequency power amplifier which has one or more high-frequency power transistors can be adjusted to a low quiescent current. By switching off the bias voltage, the high-frequency power amplifier can be very rapidly and effectively blocked. As a result, very rapid switching-on and switching-off times can be achieved.

Particular advantages are afforded when the voltage regulator is constructed as a switching regulator. Such a switching regulator provides a variable output voltage to the high-frequency power amplifier which consequently in turn produces a variable output power with a very high degree of efficiency over a wide range since the high-frequency power amplifier due to its design is always at full level. Consequently, a small drift of the output power can be achieved over temperature and time since the output power is defined by the supply voltage available from the switching regulator.

Other advantages are afforded when the switching regulator is constructed as a downward regulator. With such a switching regulator, it is possible to decrease the supply voltage to 1 V to 2 V. The maximum output voltage may in this instance be the standard operating voltage of the high-frequency power transistors of the high-frequency power amplifier, generally 12 V or 24 V.

The bias voltage generator may be configured to produce a stabilized direct-current voltage. Consequently, for example, a stabilized direct-current voltage of approximately 0.7 V may be produced during the control of a bipolar transistor or approximately from 1 V to 3 V during the control of a field-effect transistor.

A measurement device for measuring the temperature of the high-frequency power amplifier and in particular a compensation device for controlling the bias voltage generator in accordance with the measured temperature may also be provided. In this manner, it is possible in a particularly simple manner to produce a stabilized bias voltage.

The switching element, via which the bias voltage is connected to the high-frequency power amplifier, is preferably a rapid switch. Using this, the bias voltage can be connected to the input of the high-frequency power amplifier. Alternatively, with the voltage switched off, the input can be connected to earth in a low-resistance manner. The high-frequency power amplifier or the power transistors contained therein can thus be blocked as rapidly as possible.

An oscillator may be connected to the input of the high-frequency power amplifier. Via the oscillator, a high-frequency signal which is amplified by the high-frequency power amplifier can be produced.

Another aspect of the invention features a method for operating a high-frequency driver circuit for controlling an acousto-optical component in which a high-frequency power amplifier of the high-frequency driver circuit is supplied with an adjustable supply voltage, wherein the output power of the high-frequency power amplifier is adjusted via the adjustable supply voltage and by switching off a bias voltage generator, it is determined whether at the output of the high-frequency power amplifier an amplified high-frequency signal is output. In particular, by switching in a bias voltage generator, it is determined whether at the output of the high-frequency power amplifier an amplified high-frequency signal is output. In particular, the adjustable supply voltage is not regulated, but instead controlled. Using this method, a very rapid switching on and switching off with a high degree of efficiency can be achieved.

The bias voltage generator can be switched in in the 10 to 50 ns range. The bias voltage generator may in particular be switched off in the 10 to 50 ns range. Much more rapid switching-on and switching-off times of an acousto-optical component are thereby possible than in the prior art. The switching in and off can be carried out by means of a rapidly switching element.

A bias voltage can be produced by the bias voltage generator for a transistor of the high-frequency power amplifier. This bias voltage is lower when the transistor of the high-frequency power amplifier is a bipolar transistor. This may then be the range from 0.5 to 0.9 V. If, however, it is a field-effect transistor, a higher voltage can be produced by the bias voltage generator. It may then be in the range from 1 V to 3 V.

The bias voltage may be produced in a temperature-dependent manner. In particular, a stabilized bias voltage can thereby be produced, which leads to a higher degree of efficiency.

Other features and advantages of the invention will be appreciated from the following description of an embodiment of the invention, with reference to the FIGURES of the drawing which show details which are significant to the invention and from the claims. The features shown therein are not necessarily intended to be understood to be to scale and are illustrated in such a manner that the characteristic features according to the invention can be made clearly visible.

The various features can be implemented individually per se or together in any combinations in variants of the invention.

DESCRIPTION OF DRAWINGS

In the schematic drawing, an embodiment of the invention is illustrated and explained in greater detail in the following description.

FIG. 1 illustrates a high-frequency driver circuit for an acousto-optical component.

DETAILED DESCRIPTION

FIG. 1 shows in a highly schematic manner a high-frequency driver circuit 1 for an acousto-optical component 2 which in this instance is constructed as an acousto-optical modulator. The frequency of the high-frequency driver circuit 1 can be within a range of 20 to 150 MHz. The high-frequency driver circuit 1 has a high-frequency power amplifier 3 which in order to be supplied with a supply voltage is connected to a voltage regulator 4. The voltage regulator 4 is in this instance preferably constructed as a switching regulator and in a particularly preferred manner as a downward regulator.

Furthermore, the high-frequency driver circuit 1 has a bias voltage generator 5 which is connected via a switching element (or a switch) 6 to an input 7 of the high-frequency power amplifier 3. The switching element 6 can include a transistor, e.g., a bipolar transistor or a field effect transistor. The high-frequency power amplifier 3 amplifies the signal originating from an oscillator 9 into an output signal. The high-frequency power amplifier is as a result of the limitation of the supply voltage by the voltage regulator 4 operated at saturation point. The high-frequency power amplifier may be constructed as a class A, class B, class C amplifier or as a hybrid thereof.

The temperature of the high-frequency power amplifier 3 is measured by a measurement device 8. Depending on the temperature measured, via a compensation device (or a compensator) 10 a bias voltage can be adjusted by means of a bias voltage generator 5. With a closed switching element 6, the bias voltage of the bias voltage generator 5 is supplied to the high-frequency power amplifier 3. The high-frequency power amplifier 3 has high-frequency power transistors which for linear operation require a base bias voltage if they are bipolar transistors, or a gate bias voltage if they are field-effect transistors. Via the bias voltage, the amplifier stages of the high-frequency power amplifier can be adjusted to a low quiescent current, e.g., less than 0.1 mA. If the switching element 6 is opened, the bias voltage is switched off, which leads to a very rapid and effective blocking of the high-frequency power transistors of the high-frequency power amplifier 3. This in turn leads to the signal at the output of the high-frequency power amplifier 3 being very rapidly switched off. As a result of switching on and switching off the switching element 6, it is consequently determined whether the signal originating from the oscillator 9 is amplified by the high-frequency power amplifier 3 and an amplified oscillating signal is output by the high-frequency power amplifier 3 and supplied to the acousto-optical component 2 or not.

The voltage regulator 4 supplies a variable output voltage to the high-frequency power amplifier 3 which consequently in turn produces a variable output voltage with a very high degree of efficiency over a large range.

The degree of efficiency thus always remains optimal. The rapid switching on and off of the high-frequency signal at the output of the high-frequency power amplifier 3 is carried out by switching in and off the bias voltage produced by the bias voltage generator 5. This is possible in particular in the range from 10 to 50 ns.

What is claimed is:

1. A high-frequency driver circuit for an acousto-optical device, comprising:
    a high-frequency power amplifier connected to a voltage regulator and configured to be supplied with a supply voltage from the voltage regulator; and
    a bias voltage generator connected by a switch to an input of the high-frequency power amplifier, the switch being connected between the bias voltage generator and the input of the high-frequency power amplifier and configured to switch in or off the bias voltage generator to the high-frequency power amplifier,
    wherein the high-frequency power amplifier is configured to be adjusted to a quiescent current lower than a threshold current via a bias voltage provided by the bias voltage generator, and
    wherein the high-frequency power amplifier comprises one or more high-frequency power transistors, and wherein the one or more high-frequency power transistors are configured to be blocked when the bias voltage is switched off, such that an amplified signal output by the high-frequency power amplifier is switched off.

2. The high-frequency driver circuit of claim 1, wherein the voltage regulator is constructed as a switching regulator.

3. The high-frequency driver circuit of claim 2, wherein the voltage regulator is configured to adjust the supply voltage to the high-frequency power amplifier, such that the high-frequency power amplifier generates a variable output power.

4. The high-frequency driver circuit of claim 1, wherein the bias voltage generator is configured to generate a stabilized voltage.

5. The high-frequency driver circuit of claim 1, wherein the high-frequency power amplifier comprises one of a bipolar transistor and a field-effect transistor.

6. The high-frequency driver circuit of claim 1, further comprising:

a measurement device configured to measure a temperature of the high-frequency power amplifier.

7. The high-frequency driver circuit of claim 6, further comprising:
a compensation device configured to control the bias voltage generator according to the measured temperature.

8. The high-frequency driver circuit of claim 1, further comprising:
an oscillator connected to the input of the high-frequency power amplifier.

9. The high-frequency driver circuit of claim 8, wherein the high-frequency power amplifier is configured to amplify an oscillating signal from the oscillator and supply the amplified oscillating signal to the acousto-optical device.

10. The high-frequency driver circuit of claim 9, wherein the switch is configured to be switched on or switched off to determine whether or not the oscillating signal is amplified by the high-frequency power amplifier and the amplified oscillating signal is output by the high-frequency power amplifier and supplied to the acousto-optical device.

11. The high-frequency driver circuit of claim 1, wherein the bias voltage generator is configured to be switched in or off in a range of 10 to 50 ns.

12. A method of operating a high-frequency driver circuit for controlling an acousto-optical device, comprising:
supplying an adjustable supply voltage to a high-frequency power amplifier of the high-frequency driver circuit; and
adjusting an output power of the high-frequency power amplifier via the adjustable supply voltage and by controlling a bias voltage generator connected to an input of the high-frequency power amplifier with a switch coupled between the bias voltage generator and the input of the high-frequency power amplifier,
wherein whether or not an amplified high-frequency signal is output at an output of the high-frequency power amplifier is determined based on the controlling of the bias voltage generator,
wherein controlling the bias voltage generator comprises controlling the switch to switch in or off the bias voltage generator to the high-frequency power amplifier,
wherein the high-frequency power amplifier is configured to be adjusted to a quiescent current lower than a threshold current via a bias voltage provided by the bias voltage generator, and
wherein the high-frequency power amplifier comprises one or more high-frequency power transistors, and wherein the one or more high-frequency power transistors are configured to be blocked when the bias voltage is switched off, such that an amplified signal output by the high-frequency power amplifier is switched off.

13. The method of claim 12, wherein a switching time of the bias voltage generator is in a range of 10 to 50 ns.

14. The method of claim 12, wherein the bias voltage generator is configured to generate a bias voltage for a transistor of the high-frequency power amplifier.

15. The method of claim 14, wherein the bias voltage is generated based on a temperature of the high-frequency power amplifier.

16. The method of claim 12, further comprising:
supplying the amplified high-frequency signal to the acousto-optical device.

17. A high-frequency driver circuit for an acousto-optical device, comprising:
a high-frequency power amplifier connected to a voltage regulator and configured to be supplied with a supply voltage from the voltage regulator;
a bias voltage generator connected by a switch to an input of the high-frequency power amplifier; and
an oscillator connected to the input of the high-frequency power amplifier,
wherein the high-frequency power amplifier is configured to amplify an oscillating signal from the oscillator and supply the amplified oscillating signal to the acousto-optical device, and
wherein the switch is configured to be switched on or switched off to determine whether or not the oscillating signal is amplified by the high-frequency power amplifier and the amplified oscillating signal is output by the high-frequency power amplifier and supplied to the acousto-optical device.

18. The high-frequency driver circuit of claim 17, wherein the voltage regulator is constructed as a switching regulator.

19. The high-frequency driver circuit of claim 17, wherein the bias voltage generator is configured to generate a stabilized voltage.

20. The high-frequency driver circuit of claim 17, wherein the high-frequency power amplifier is configured to be adjusted to a quiescent current lower than a threshold current via a bias voltage provided by the bias voltage generator.

21. The high-frequency driver circuit of claim 17, wherein the high-frequency power amplifier comprises one of a bipolar transistor and a field-effect transistor.

22. The high-frequency driver circuit of claim 17, further comprising:
a measurement device configured to measure a temperature of the high-frequency power amplifier.

23. The high-frequency driver circuit of claim 17, wherein the bias voltage generator is configured to be switched in or off in a range of 10 to 50 ns.

* * * * *